(12) United States Patent
Darr et al.

(10) Patent No.: US 10,283,917 B1
(45) Date of Patent: May 7, 2019

(54) ELECTRICAL UNIT (71) Applicant: Lear Corporation, Southfield, MI (US)

(72) Inventors: Christopher J Darr, Livonia, MI (US); Peter Kowtun, Plymouth, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 15/790,953

(22) Filed: Oct. 23, 2017

(51) Int. Cl.
*H01R 13/68* (2011.01)
*H01R 27/02* (2006.01)
*H01R 13/502* (2006.01)

(52) U.S. Cl.
CPC .......... *H01R 13/68* (2013.01); *H01R 13/502* (2013.01); *H01R 27/02* (2013.01)

(58) Field of Classification Search
CPC .................................................... H01R 13/68
See application file for complete search history.

(56) References Cited

U.S. PATENT DOCUMENTS

| | | | | |
|---|---|---|---|---|
| 4,842,534 A | * | 6/1989 | Mobley | H01H 85/2035 337/191 |
| 5,023,752 A | | 6/1991 | Detter | |
| 5,795,193 A | | 8/1998 | Yang | |
| 5,995,380 A | * | 11/1999 | Maue | B60R 16/0238 174/254 |
| 6,015,302 A | | 1/2000 | Butts | |
| 6,126,457 A | * | 10/2000 | Smith | B60R 16/0238 439/76.2 |
| 6,227,913 B1 | * | 5/2001 | Davis | H02B 1/18 439/620.26 |
| 6,325,640 B1 | | 12/2001 | Kasai | |
| 6,333,846 B1 | * | 12/2001 | Hashizawa | H01H 9/085 337/198 |
| 6,396,380 B1 | * | 5/2002 | Girke | H01H 85/044 337/188 |
| 6,445,563 B1 | * | 9/2002 | Endo | H01H 85/0417 200/61.08 |
| 6,456,188 B1 | * | 9/2002 | Tsuchiya | H01H 85/205 337/187 |
| 6,545,861 B1 | | 4/2003 | Hayes et al. | |
| 6,570,088 B1 | * | 5/2003 | Depp | B60R 16/0238 174/50 |
| 6,922,331 B2 | * | 7/2005 | Ikeda | H01R 9/226 361/624 |
| 7,095,628 B2 | * | 8/2006 | Friedrich | H01H 85/2045 174/71 B |

(Continued)

*Primary Examiner* — Alexander Gilman
(74) *Attorney, Agent, or Firm* — Fishman Stewart PLLC (57) ABSTRACT

An electrical unit includes a first housing member, a second housing member, and a fuse assembly connected to the first housing member. The first housing member and the second housing member may provide a chamber to receive at least one electrical connector such that the fuse assembly is disposed at least partially between the first housing member and the at least one electrical connector. The first housing member may be configured to retain said at least one electrical connector. The fuse assembly may include a plurality of fuses having current capacities of at least 80 amps. The fuse assembly may include a bus bar and a plurality of fuses fixed to the bus bar. Each of said at least one electrical connector may include a plurality apertures or recesses disposed in a plurality of rows and a plurality of columns.

17 Claims, 10 Drawing Sheets

(56) References Cited

U.S. PATENT DOCUMENTS

| | | | | |
|---|---|---|---|---|
| 7,347,733 B2* | | 3/2008 | Murakami | H01H 85/044 439/620.27 |
| 7,488,213 B2* | | 2/2009 | Plummer | H01H 11/0031 439/620.33 |
| 7,494,348 B1* | | 2/2009 | Tyler | B60R 16/0215 439/76.2 |
| 7,499,262 B1* | | 3/2009 | Darr | H01R 9/226 361/626 |
| 7,504,926 B2* | | 3/2009 | Bessho | H01H 85/2035 337/189 |
| 7,670,184 B2* | | 3/2010 | Akahori | H02G 3/086 439/620.27 |
| 7,708,596 B2* | | 5/2010 | Puschkat | H01H 85/044 439/620.27 |
| 8,052,481 B2* | | 11/2011 | Azad | H01H 85/202 439/676 |
| 8,395,061 B2* | | 3/2013 | Asao | H02G 3/16 174/50 |
| 8,573,987 B1* | | 11/2013 | Schweitzer | H01R 9/226 439/457 |
| 8,961,198 B2* | | 2/2015 | Ferran Palau | H01R 4/58 439/620.27 |
| 9,124,081 B2* | | 9/2015 | Kowtun | H02G 3/16 |
| 9,166,312 B2* | | 10/2015 | Bakatsias | H01R 12/75 |
| 9,265,164 B2* | | 2/2016 | Darr | H02G 3/10 |
| 9,346,422 B2* | | 5/2016 | Kouzaki | B60R 16/0238 |
| 9,462,702 B2* | | 10/2016 | Darr | H05K 3/40 |
| 9,728,363 B2* | | 8/2017 | Carnick | H01H 85/0241 |
| 9,873,392 B2* | | 1/2018 | Matsumura | B60R 16/0238 |
| 2001/0036773 A1* | | 11/2001 | Suzuki | H01R 9/2425 439/701 |
| 2002/0061666 A1* | | 5/2002 | Sato | H01R 9/226 439/76.2 |
| 2007/0167040 A1* | | 7/2007 | Ogawa | H05K 7/026 439/76.2 |
| 2010/0051311 A1* | | 3/2010 | Nakagawa | H01R 11/287 174/59 |

* cited by examiner

ELECTRICAL UNIT

TECHNICAL FIELD

The present disclosure generally relates to electrical units, including electrical units, junction boxes, and power distribution boxes that may be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical units may be utilized in connection with separate pre-fuse assemblies that may require additional cables and/or wiring harnesses. Some electrical units may be configured for external connections with wiring harnesses.

There is a desire for solutions/options that minimize or eliminate one or more challenges or shortcomings of electrical units. The foregoing discussion is intended only to illustrate examples of the present field and should not be taken as a disavowal of scope.

SUMMARY

In embodiments, an electrical unit may include a first housing member, a second housing member, and/or a fuse assembly connected to the first housing member. The first housing member and the second housing member may provide a chamber to receive at least one electrical connector such that the fuse assembly is disposed at least partially between the first housing member and the at least one electrical connector. The first housing member may be configured to retain said at least one electrical connector. The fuse assembly may include a plurality of fuses having current capacities of at least 80 amps. The fuse assembly may include a bus bar and a plurality of fuses fixed to the bus bar. Each of said at least one electrical connector may include a plurality apertures or recesses disposed in a plurality of rows and a plurality of columns.

With embodiments, an electrical unit may include at least on fastener configured to extend from a top side of the second housing member, through the second housing member, and into the first housing member. The second housing member may include a connector housing portion, a fuse housing portion, and/or a circuit board assembly that may disposed at least partially between the connector housing portion and the fuse housing portion. An electrical unit may include a circuit board assembly disposed in the second housing member. A circuit board assembly may include a plurality of electrical terminals connected to a circuit board. The plurality of electrical terminals may be configured for insertion into the at least one electrical connector. An electrical unit may include a fuse bus bar connected to the first housing member. A circuit board assembly may include a circuit board bus bar connected to the fuse bus bar.

In embodiments, a first housing member may include a recess configured to at least partially receive a wiring harness cable connected to the at least one electrical connector. A recess may include a drain port. An electrical unit may include an electrically conducting stud connected to the fuse assembly and extending through an aperture in the first housing member. A first housing member is configured to be mounted to a vehicle. An electrical unit may include a cover connected to the second housing member, and a plurality of fuses connected to the second housing member. The plurality of fuses may be disposed at least partially between the second housing member and the cover. In an assembled configuration, at least some of the fuse assembly may be disposed between a bottom wall of the first housing member and said at least one electrical connector. A first housing member may include a first recess, the second housing member may include a second recess, and, in an assembled configuration, the first recess may be aligned with the second recess to provide an aperture configured to receive a cable connected to said at least one electrical connector.

With embodiments, an electrical assembly may include an electrical unit that may include a first housing member, a second housing member connected to the first housing member, and/or a fuse assembly connected to the first housing member. The fuse assembly may be disposed at least partially between the first housing member and the second housing member. The electrical assembly may include an electrical connector configured for connection with a wiring harness. The electrical connector may be disposed entirely within the electrical unit. A fuse assembly may be disposed at least partially between the electrical connector and a base wall of the first housing member.

In embodiments, a method of assembling an electrical assembly may include providing a first housing member, providing a second housing member including a circuit board and a plurality of electrical terminals connected to the circuit board, connecting a fuse assembly to the first housing member, disposing at least one electrical connector of a wiring harness such that at least some of the fuse assembly is disposed between the at least one electrical connector and a bottom wall of the first housing member, and/or connecting the first housing member with the second housing member. Connecting the first housing member with the second housing member may include inserting the plurality of electrical terminals into the at least one electrical connector. A second housing member may include a circuit board bus bar. Connecting the first housing member with the second housing member may include inserting a portion of the circuit board bus bar into an electrical terminal connected to a bus bar of the fuse assembly.

The foregoing and other aspects, features, details, utilities, and/or advantages of embodiments of the present disclosure will be apparent from reading the following description, and from reviewing the accompanying drawings.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they are not intended to limit the present disclosure to these embodiments and/or examples. On the contrary, the present disclosure is intended to cover alternatives, modifications, and equivalents.

Figure 1:
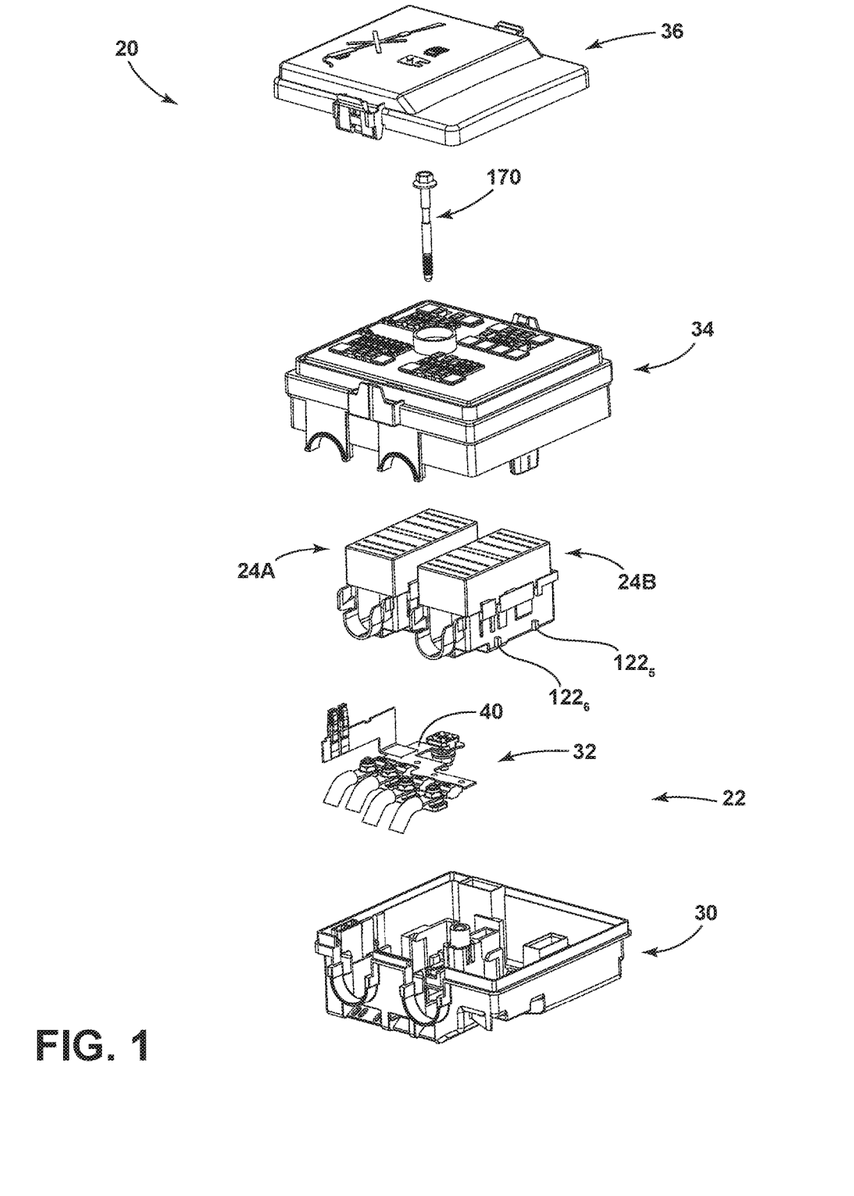
FIG. 1 is an exploded perspective view generally illustrating an embodiment of an electrical unit according to teachings of the present disclosure.
Figure 2:
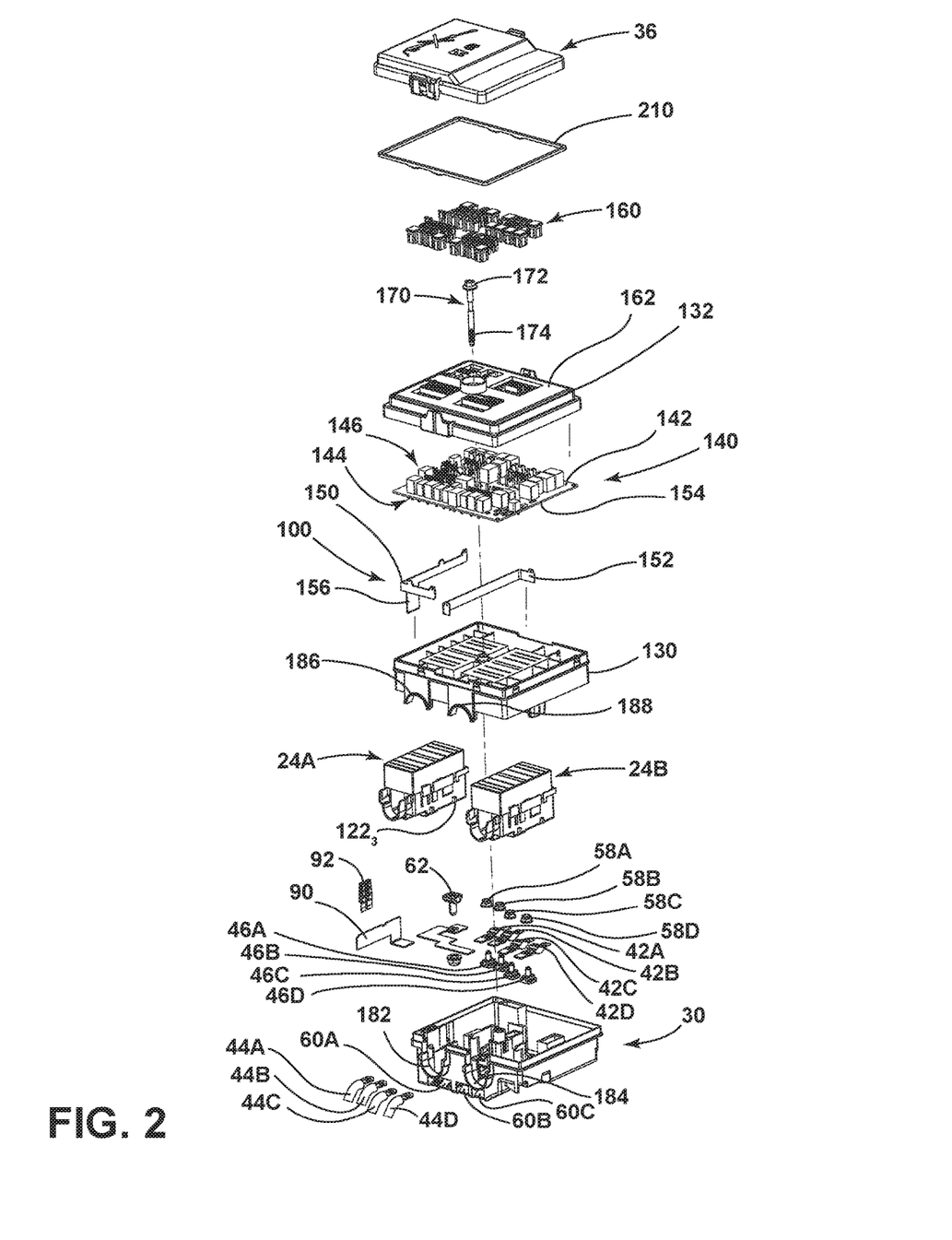
FIG. 2 is an exploded perspective view generally illustrating an embodiment of an electrical unit according to teachings of the present disclosure.
Figure 3:
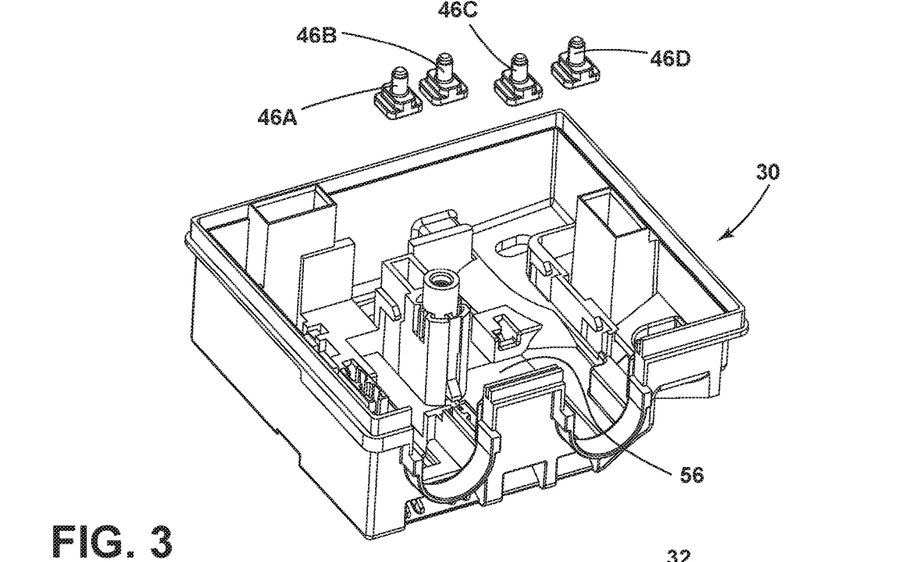
FIG. 3 is a perspective view generally illustrating an embodiment of an electrical unit according to teachings of the present disclosure.
Figure 4:
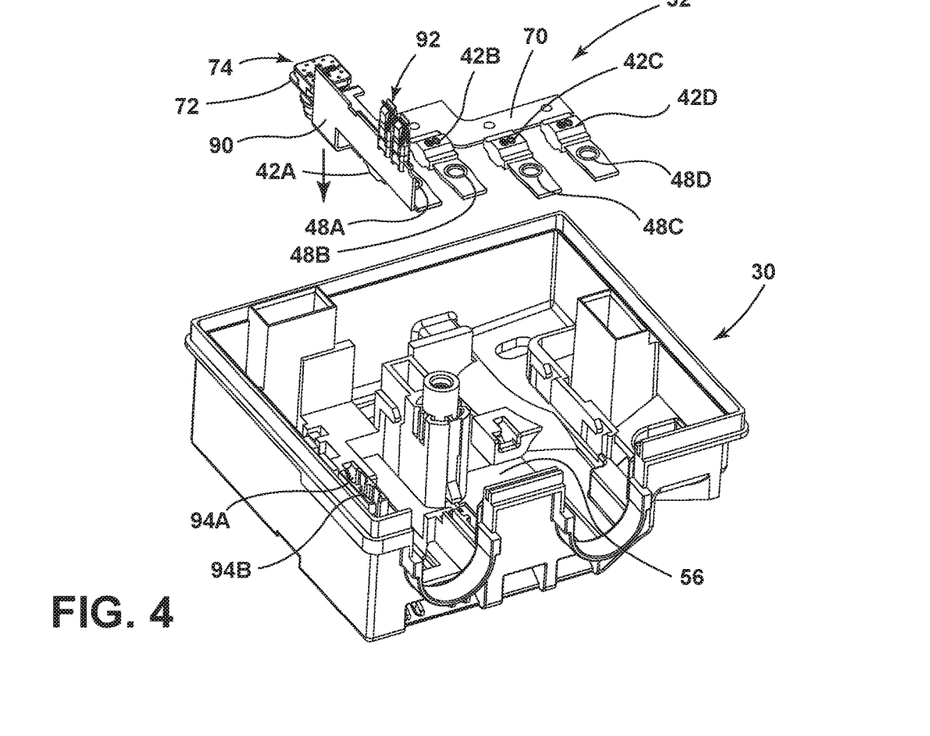
FIGS. 4-7 are perspective views generally illustrating embodiments of electrical units, including fuse assemblies, according to teachings of the present disclosure.
Figure 5:
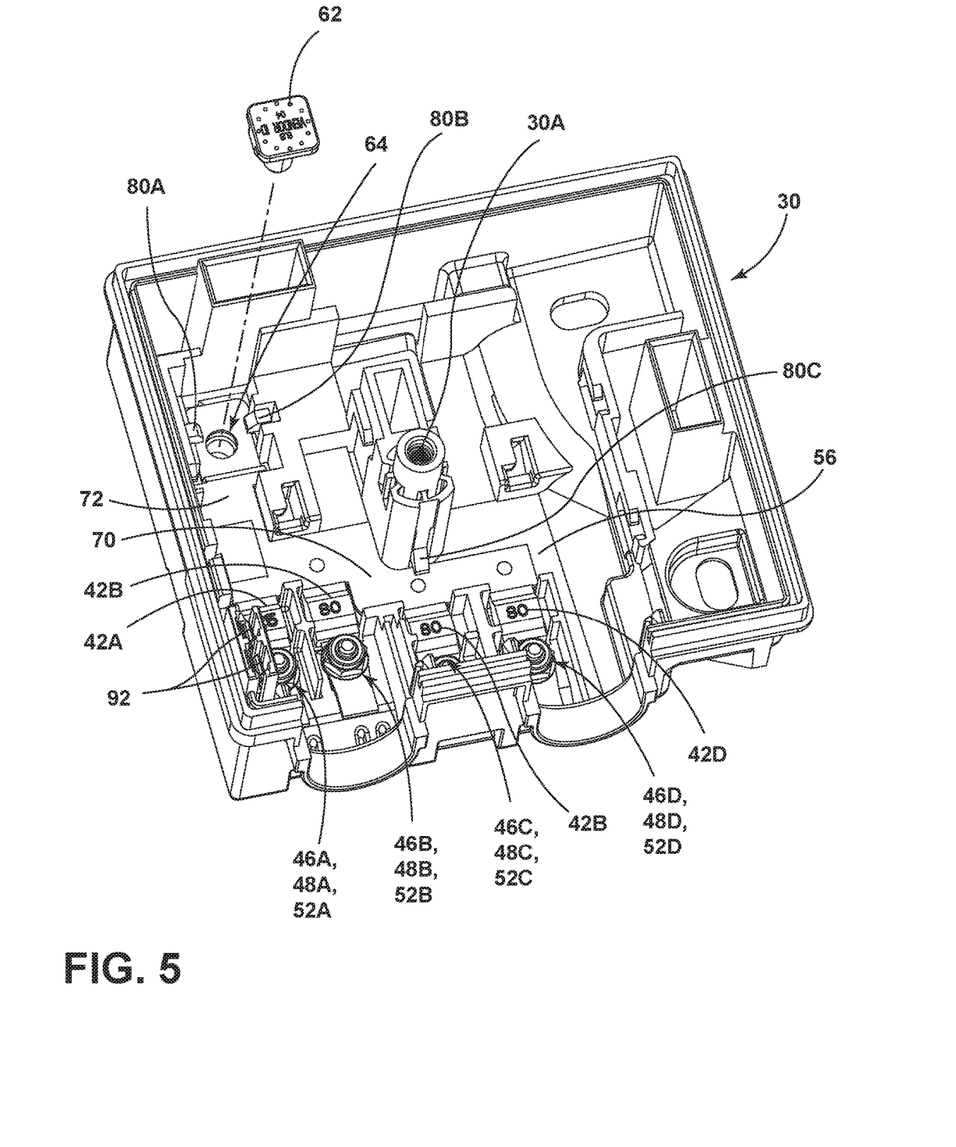
Figure 6:
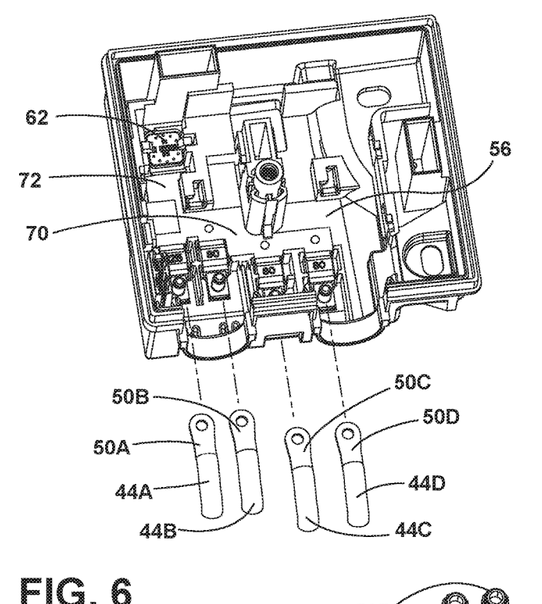
Figure 7:
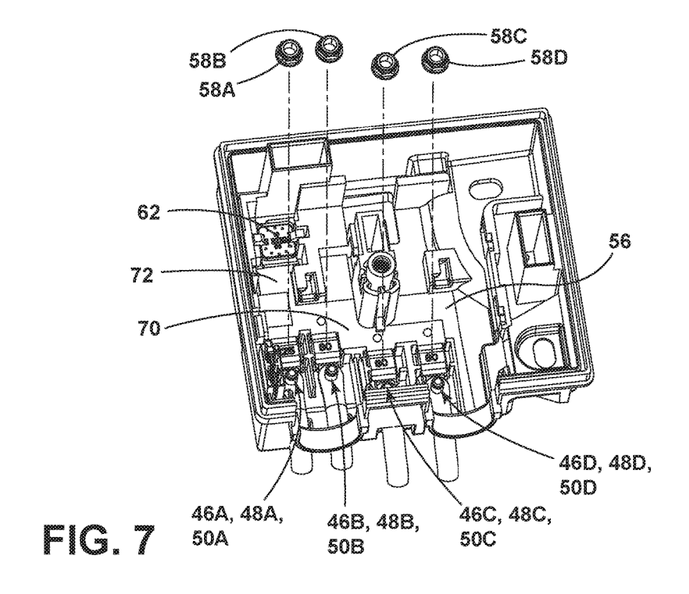
Figure 8:
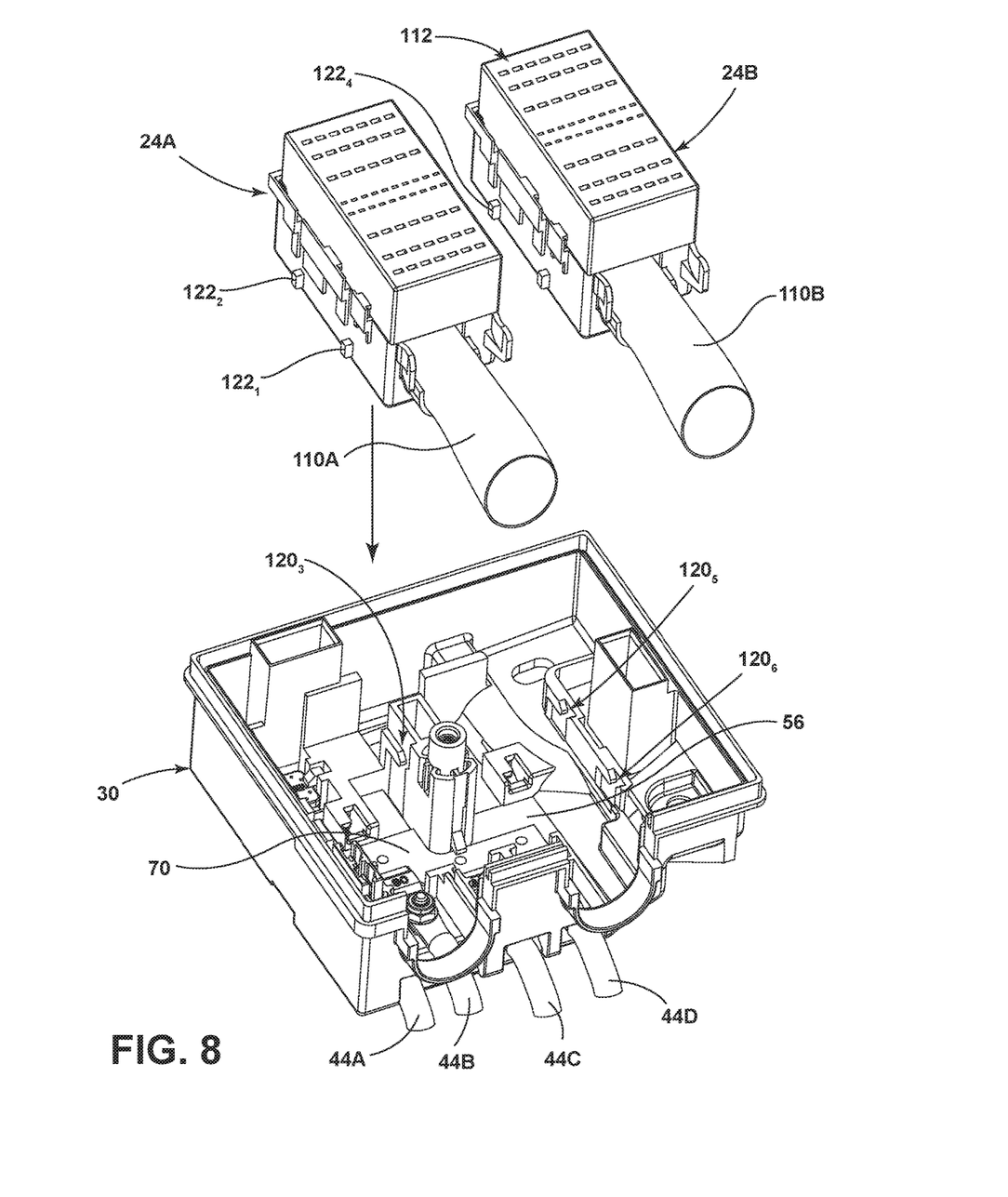
FIG. 8 is a perspective view generally illustrating embodiments of an electrical unit and electrical connectors according to teachings of the present disclosure.
Figure 9:
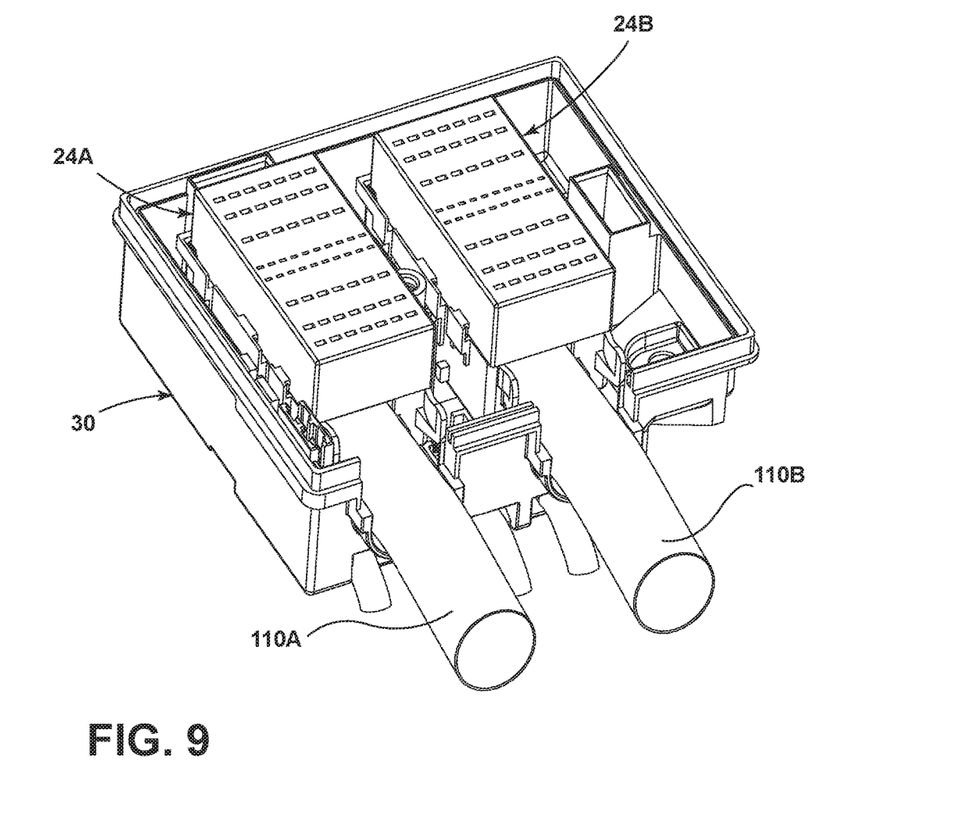
FIG. 9 is a perspective view generally illustrating embodiments of an electrical unit and electrical connectors according to teachings of the present disclosure.
Figure 10:
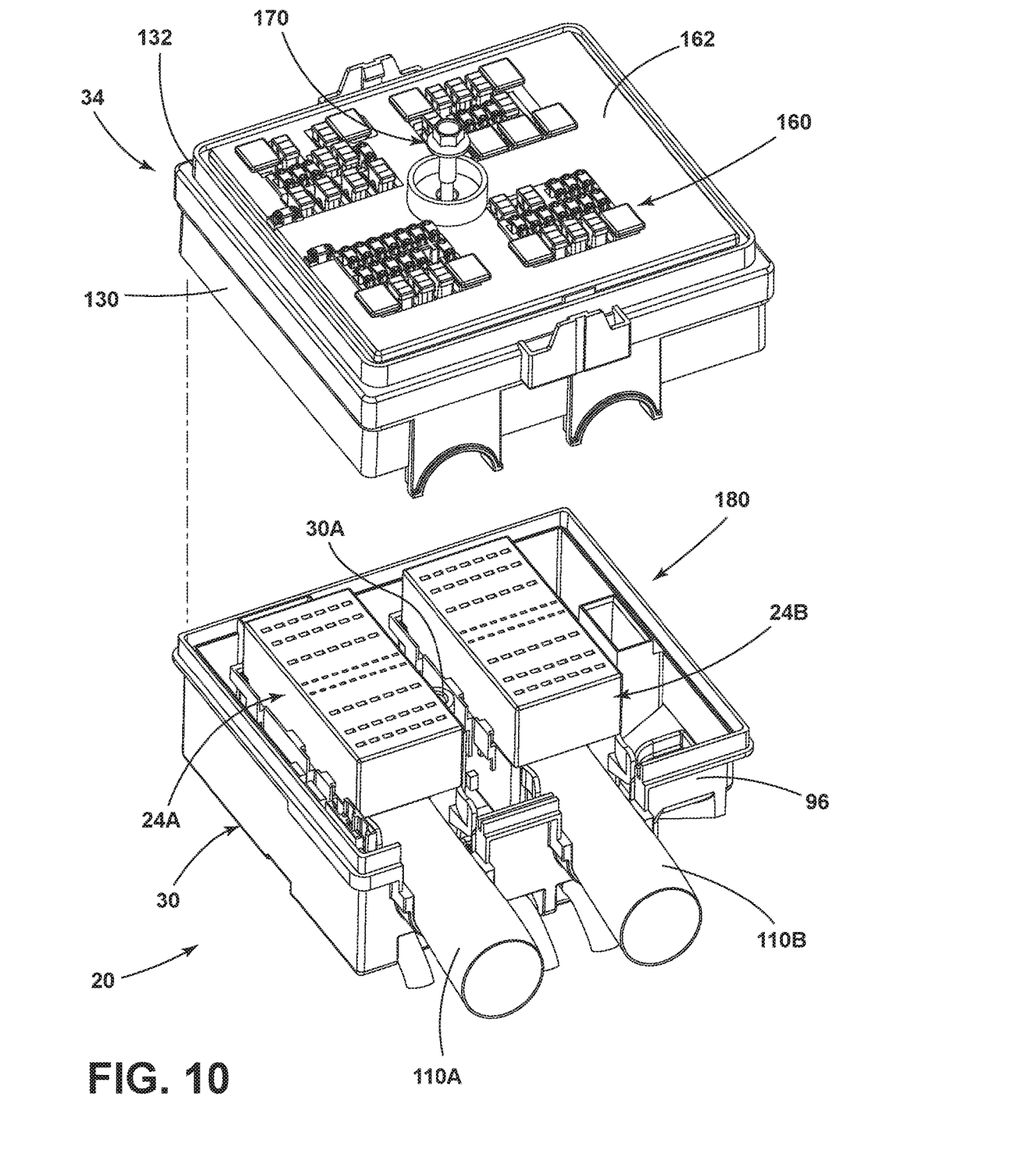
FIG. 10 is a perspective view generally illustrating embodiments of an electrical unit, including a first housing member and a second housing member, and electrical connectors, according to teachings of the present disclosure.
Figure 11:
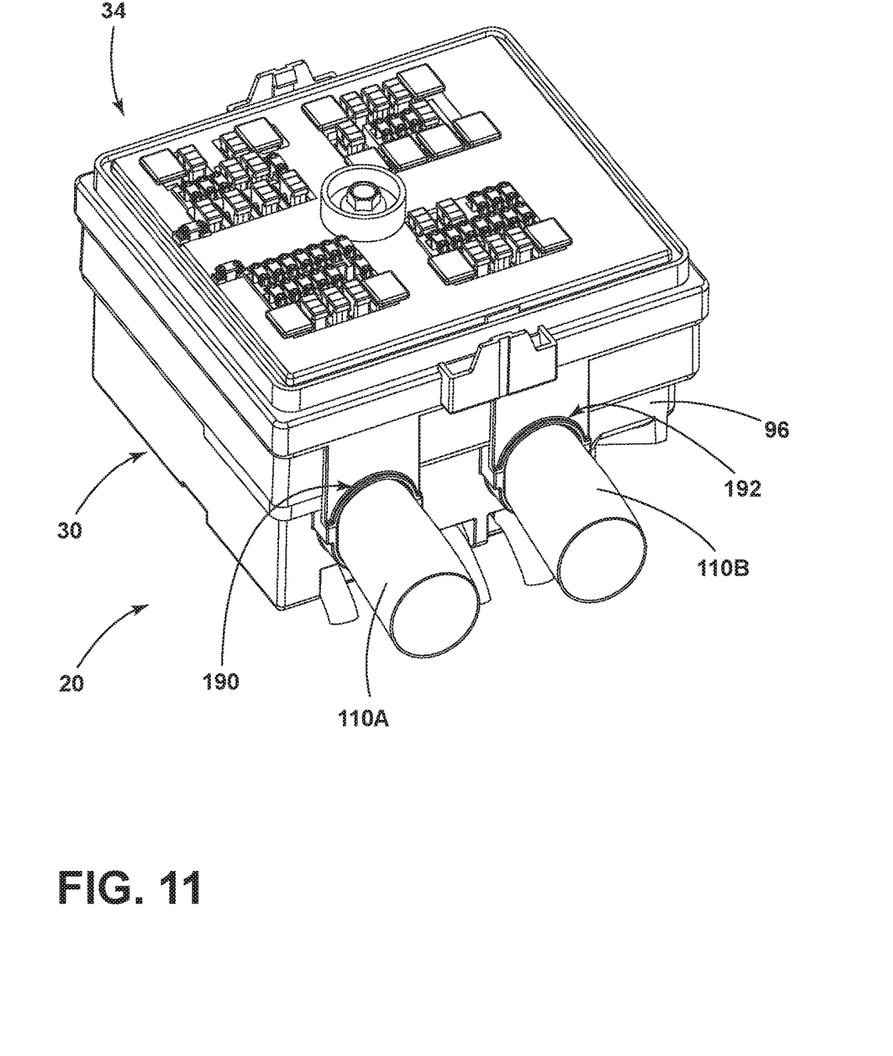
FIG. 11 is a perspective view generally illustrating embodiments of an electrical unit, including a first housing member and a second housing member, and electrical connectors, according to teachings of the present disclosure.

In embodiments, such as generally illustrated in FIGS. 1 and 2, an electrical assembly 20 may include an electrical unit 22 and/or one or more electrical connectors (e.g., electrical connectors 24A, 24B). An electrical unit 22 may include a first housing member 30 (e.g., a connector housing portion), a fuse assembly 32, a second housing member 34 (e.g., a fuse housing portion), and/or a cover 36. A first housing member 30 may be configured for connection with a second housing member 34. A cover 36 may be configured for connection with second housing member 34.

With embodiments, a first housing member 30 may be configured to house a fuse assembly 32 and/or one or more connectors 24A, 24B, such as wiring harness connectors. A fuse assembly 32 may be configured as a pre-fuse assembly, may be referred to herein as a pre-fuse assembly, and/or may be configured to limit current from a power source (e.g., a vehicle battery), but is not limited to a pre-fuse assembly. A pre-fuse assembly 32 may include, for example and without limitation, a fuse or pre-fuse bus bar 40 and/or a plurality of fuses (e.g., fuses 42A, 42B, 42C, 42D) that may be connected, electrically and/or physically, to fuse bus bar 40. Fuses 42A, 42B, 42C, 42D may be configured for connection with one or more corresponding cables 44A, 44B, 44C, 44D that may be connected, for example and without limitation, to vehicle components, such as a pump and/or a motor. Cables 44A, 44B, 44C, 44D may be connected to fuses 42A, 42B, 42C, 42D via studs 46A, 46B, 46C, 46D that may be connected to first housing member 30 and/or that may extend through respective apertures 48A, 48B, 48C, 48D in fuses 42A, 42B, 42C, 42D and apertures 50A, 50B, 50C, 50D in cables 44A, 44B, 44C, 44D. Studs 46A, 46B, 46C, 46D may, for example and without limitation, may be configured to slide into corresponding slots 52A, 52B, 52C, 52D of first housing member 30 and/or may be connected via a snap fit to first housing member 30 via one or more snap members 54A, 54B, 54C, 54D. Slots 52A, 52B, 52C, 52D may be disposed in a base or bottom wall 56 of first housing member 30. One or more nuts 58A, 58B, 58C, 58D may be screwed onto studs 46A, 46B, 46C, 46D, such as to fasten cables 44A, 44B, 44C, 44D with fuses 42A, 42B, 42C, 42D and/or to connect fuse assembly 32 with first housing member 30. In embodiments, fuses 42A, 42B, 42C, 42D may be configured as high current fuses and may, for example and without limitation, include current capacities of at least 50 amps, such as about 80 amps and/or about 125 amps. The current capacities of fuses 42A, 42B, 42C, 42D may or may not be the same. First housing member 30 may include one or more apertures (e.g., apertures 60A, 60B, 60C) that may be configured to receive cables 44A, 44B, 44C, 44D. For example and without limitation, a side wall 96 of first housing member 30 may include apertures 60A, 60B, 60C. Side wall 96 may be disposed substantially perpendicularly to base or bottom wall 56.

In embodiments, a pre-fuse assembly 32 may include a power post 62 that may extend through an aperture 64 in pre-fuse bus bar 40 and/or a corresponding aperture 66 in first housing member 30 such that power post 62 may extend outside of first housing member 30 (e.g., downward). Power post 62 may, for example and without limitation, be configured for connection with a power source, such as a vehicle battery, and may be electrically conducting. A pre-fuse bus bar 40 may include a first portion 70 and/or a second portion 72. First portion 70 may be disposed substantially perpendicularly to second portion 72. First portion 70 and second portion 72 may be disposed substantially in a common plane (e.g., a horizontal plane). First portion 70 may be connected with fuses 42A, 42B, 42C that may extend generally perpendicularly to first section 70 and/or may extend generally in parallel with second section 72. Aperture 66 may be disposed at or about an end 74 of second portion 72. First housing member 30 may include one or more latch members 80A, 80B, 80C that may be configured to retain second portion 72, at least in one direction (e.g., a vertical direction). Latch member(s) 80A, 80B, 80C may extend from base or bottom wall 56 and/or may hold/retain pre-fuse bus bar 40 in contact with base or bottom wall 56.

With embodiments, a pre-fuse bus bar 40 may include a third portion 90 that may extend perpendicularly to first portion 70 and/or second portion 72 (e.g., may extend substantially vertically and/or toward second housing member 34). One or more electrical terminals 92 may be connected (e.g., fixed) to third portion 90. First housing member 30 may include one or more recesses or apertures 94A, 94B that may be configured to receive electrical terminal 92. Recesses or apertures 94A, 94B may, for example, extend substantially vertically. An electrical terminal 92 may be configured for connection with a bus bar of second housing member 34, such as, for example and without limitation, a circuit board bus bar 100 (e.g., to provide electrical power to second housing member 34).

In embodiments, a first housing member 30 may be configured to partially or entirely receive one or more connectors 24A, 24B. A connector 24A, 24B may be connected to and/or configured for connection with a wiring harness cable 110A, 110B. A connector 24A, 24B may, for example and without limitation, include a plurality of apertures 112 that may be disposed in a plurality of rows and/or a plurality of columns. Some or all of apertures 112 that may each correspond to a respective electrical terminal of a connector 24A, 24B. For example and without limitation, a connector may include at least about 50 apertures 112 (e.g., about 58 apertures). A first housing member 30 may include one or more retaining features 120 that may be configured to retain a connector 24A, 24B relative to first housing member 30 in at least one direction (e.g., a vertical direction). Retaining features 120 may be configured to engage corresponding connector features 122 (e.g., recesses, protrusions, etc.) of connectors 24A, 24B. For example and without limitation, first housing member 30 may include a first set of retaining features $120_1, 120_2, 120_3$ that may be configured to engage connector features $122_1, 122_2, 122_3$ of a first connector 24A and/or first housing member 30 may include a second set of retaining features $120_4$, $120_5$, $120_6$ that may be configured to engage connector features $122_4$, $122_5$, $122_6$ of a second connector 24B. If first connector 24A and/or second connector 24B are inserted into first housing member 30 (e.g., substantially vertically downward), retaining features 120 may receive respective connector features 122 of connectors 24A, 24B. Connectors 24A, 24B may then be moved horizontally to a position in which retaining features 120 may restrict and/or prevent vertical movement. Retaining features 120 may be configured to retain first connector 24A and/or second connector 24B that apertures 112 may open away from fuse assembly 32 and/or base or bottom wall 56 (e.g., open toward second housing member 34). In a connected/assembled configuration, at least a portion (e.g., a bottom half) of first connector 24A and/or second connector 24B may be disposed in first housing member 30.

With embodiments, such as generally illustrated in FIGS. 1, 2, 10, and 11, a second housing member 34 may include a first/bottom portion 130 and a second/top portion 132. First portion 130 and second portion 132 may be connected together. First portion 130 and/or second portion 132 may be configured to house a circuit board assembly 140. A circuit board assembly 140 may include a circuit board 142, a circuit board bus bar 100, electrical terminals 144, and/or electrical components 146 (e.g., relays, switches, fuses, resistors, capacitors, power supplies, controllers, processors, etc.). A circuit board bus bar 100 may include a first section 150 and a second section 152 that may or may not be separate from each other. Circuit board bus bar 100 may be connected to a first/bottom side 154 of circuit board 142. A first section 150 of circuit board bus bar 100 may be connected to circuit board 142 and/or may be connected to (e.g., inserted into) an electrical terminal 92 of pre-fuse bus bar 40. For example and without limitation, first section 150 may include an extension 156 that may extend (e.g., vertically downward) through first portion 130 of second housing member 34 into electrical terminal or terminals 92, which may include extending into recesses or apertures 94A, 94B of first housing member 30.

In embodiments, a second/top portion 152 of second housing member 34 may be configured to at least partially receive one or more fuses 160. For example and without limitation, a plurality of fuses 160 may be inserted into a top side 162 of second portion 152 and may extend through top side 162 to connect with circuit board assembly 140.

With continued reference to FIGS. 1, 2, 10, and 11, in embodiments, an electrical unit 22 may include one or more fasteners (e.g., fastener 170), such as a bolt. Fasteners 170 may be configured to connect second housing member 34 with first housing member 30 and/or with one or more electrical connectors 24A, 24B. For example and without limitation, a head 172 of a fastener 170 may be disposed at a top side 162 of second portion 132 of second housing member 34 and a body 174 of fastener 170A may extend into or through second portion 132, circuit board 142, and/or first portion 130 and may extend into (e.g., be screwed into) an aperture 30A of first housing member. Additionally or alternatively, a fastener 170 may be screwed into a connector 24A, 24B. An electrical unit 22 may include a plurality of fasteners 170 that may, for example and without limitation, be screwed into respective apertures 30A of first housing member 30 and/or into electrical connectors 24A, 24B.

In embodiments, a first housing member 30 and a second housing member 34 may cooperate to provide an internal chamber 180. Internal chamber 180 may be configured to partially or entirely receive one or more connectors, such as a first connector 24A and/or a second connector 24B. With embodiments, first housing member 30 and second housing member 34 may cooperate to provide one or more apertures through which a wires or cables (e.g., wiring harness cables 110A, 110B) may extend. For example and without limitation, first housing member 30 may include a first recess 182 and a second recess 184 that may, in an assembled configuration, align with a first recess 186 and a second recess 188, respectively, of second housing member 34 to provide a first aperture 190 and a second aperture 192, respectively. First aperture 190 may be configured such that first connector 24A may not fit through first aperture 190 and/or second aperture 192 may be configured such that second connector 24B may not fit through second aperture 192 (e.g., first and second apertures 190, 192 may be smaller, in at least one dimension, than first and second connectors 24A, 24B). In embodiments, in an assembled configuration, at least some of a pre-fuse assembly 32 may be disposed between a base or bottom wall 56 of first housing member 30 and first connector 24A and/or may be disposed between base or bottom wall 56 and second connector 24B. With embodiments, pre-fuse assembly 32 may be the only thing disposed between first connector 24A and first housing member 30 and/or between second connector 24B and second housing member 34 (e.g., in a vertical direction). In embodiments, aperture 190 may be disposed at least partially above aperture 60A and/or aperture 192 may be disposed at least partially above aperture 60C. Some or all of apertures 60A, 60B, 60C, 190, and/or 192 may be separate/independent from each other.

Figure 12:
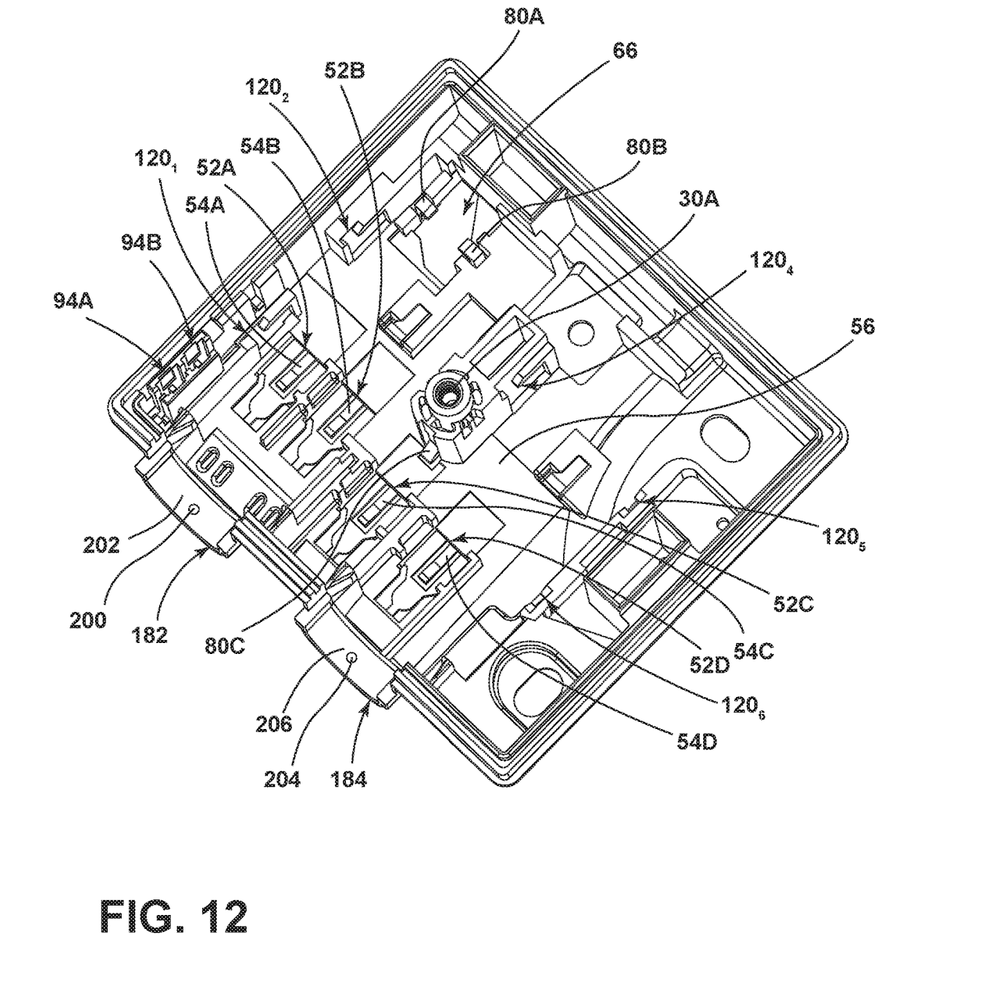
FIG. 12 is a perspective view generally illustrating an embodiment of a first housing member of an electrical unit according to teachings of the present disclosure.

In embodiments, such as generally illustrated in FIG. 12, an electrical unit 22 may include one or more drain ports through which fluid (e.g., water) may be permitted to exit electrical unit 22. For example and without limitation, a first drain port 200 may be disposed in a bottom surface 202 of first recess 182 of first housing member 30 and a second drain port 204 may be disposed in a bottom surface 206 of second recess 184 of first housing member 30.

With embodiments, an electrical unit 22 may include a cover 36 that may be configured to at least partially cover second portion 132 of second housing member 34 and/or some or all of fuses 160 that may be connected to second portion 132. A sealing member 210 may be disposed between cover 36 and second portion 132 to provide a fluid seal between cover 36 and second portion 132.

With embodiments, an electrical unit 22 may not include any external connectors or slots for directly connecting with corresponding connectors (e.g., all electrical connections may be made entirely within electrical unit 22). In embodiments, an electrical unit 22 may be configured as a power distribution box with an integrated pre-fuse assembly and a top down configuration.

In embodiments, such as generally illustrated in FIGS. 3-12, a method of assembling an electrical assembly 20 may include providing one or more portions of an electrical unit 22, which may include providing a first housing member 30, providing a second housing member 34, and/or providing a fuse assembly 32. A second housing member 34 may include a circuit board assembly 140 that may include a circuit board 142 and/or a plurality of electrical terminals 144 connected to circuit board 142. The method may include connecting a fuse assembly 32 to first housing member 30 (see, e.g., FIGS. 3-5). Connecting a fuse assembly 32 to first housing member 30 may include sliding one or more studs 46A, 46B, 46C, 46D into slots 52A, 52B, 52C, 52D of first housing member 30 such that the one or more studs 46A, 46B, 46C, 46D snap into place. Fuses 42A, 42B, 42C, 42D which may be fixed to a pre-fuse bus bar 40, may be disposed over studs 46A, 46B, 46C, 46D such that studs 46A, 46B, 46C, 46D are inserted into apertures of fuses 42. Connecting a fuse assembly 32 to first housing member 30 may include connecting a second portion 72 of pre-fuse bus bar 40 to first housing member 30 via a snap connection, such as via a pair of opposing latch members 80A, 80B and/or may include connecting a first portion 70 of pre-fuse bus bar 40 to first housing member 30 via a snap connection, such as via a latch member 80C.

With embodiments, a method of assembling an electrical assembly 20 may include disposing at least one electrical connector 24A, 24B of a wiring harness such that at least some of fuse assembly 32 is disposed between the at least one electrical connector 24A, 24B and a bottom wall 56 of first housing member 30. The method may include connecting first housing member 30 with second housing member 34. First housing member 30 and the second housing member 34 may be connected such that the at least one electrical connector 24A, 24B is disposed at least partially between fuse assembly 32 and the second housing member 34 (e.g., in an internal chamber 180).

With embodiments, connecting the first housing member 30 with the second housing member 34 may include inserting a plurality of electrical terminals 144 of circuit board assembly 140 into the at least one electrical connector 24A, 24B. Second housing member 34 may include a circuit board bus bar 100. Connecting first housing member 30 with second housing member 34 may include inserting a portion (e.g., extension 156) of circuit board bus bar 100 into an electrical terminal 92 connected to a pre-fuse bus bar 40. One or more fasteners 170 may be inserted into and/or through second housing member 34 and screwed into first housing member 30 (e.g., into an aperture 30A of first housing member 30) and/or into electrical connector 24A and/or 24B. A cover 36 may be connected to second housing member 34.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are intended to be inclusive unless such a construction would be illogical.

It is intended that all matter contained in the above description or shown in the accompanying drawings shall be interpreted as illustrative only and not limiting. Changes in detail or structure may be made without departing from the present disclosure.

What is claimed is:

1. An electrical unit, comprising:
a first housing member;
a second housing member; and
a fuse assembly connected to the first housing member; wherein the first housing member and the second housing member provide a chamber to receive at least one electrical connector such that the fuse assembly is disposed at least partially between the first housing member and the at least one electrical connector; and in an assembled configuration, at least some of the fuse assembly is disposed between a bottom wall of the first housing member and said at least one electrical connector.

2. The electrical unit of claim 1, wherein the first housing member includes one or more latches that retain the fuse assembly in contact with the bottom wall of the first housing member.

3. The electrical unit of claim 1, wherein the fuse assembly includes a plurality of fuses having current capacities of at least 80 amps.

4. The electrical unit of claim 1, wherein the fuse assembly includes a bus bar and a plurality of fuses fixed to the bus bar, wherein the plurality of fuses are disposed in parallel with the bottom wall of the first housing member.

5. The electrical unit of claim 1, wherein each of said at least one electrical connector includes a plurality apertures or recesses disposed in a plurality of rows and a plurality of columns.

6. The electrical unit of claim 1, including at least one fastener configured to extend from a top side of the second housing member, through the second housing member, and into the first housing member.

7. The electrical unit of claim 1, wherein the second housing member includes a connector housing portion, a second portion, and a circuit board assembly disposed at least partially between the connector housing portion and the second portion.

8. The electrical unit of claim 1, including a circuit board assembly disposed in the second housing member.

9. The electrical unit of claim 8, wherein the circuit board assembly includes a plurality of electrical terminals connected to a circuit board, and the plurality of electrical terminals are configured for insertion into the at least one electrical connector.

10. The electrical unit of claim 8, including a fuse bus bar connected to the first housing member, wherein the circuit board assembly includes a circuit board bus bar connected to the fuse bus bar.

11. The electrical unit of claim 1, wherein the first housing member includes a recess configured to at least partially receive a wiring harness cable connected to the at least one electrical connector, wherein the recess includes a drain port.

12. The electrical unit of claim 1, including an electrically conducting stud connected to the fuse assembly and extending through an aperture in the first housing member away from the second housing member.

13. The electrical unit of claim 1, wherein a first electrical connector of the at least one electrical connector includes at least 50 apertures.

14. An electrical unit, comprising:
a first housing member;
a second housing member;
a fuse assembly connected to the first housing member; and
a plurality of studs configured to connect the fuse assembly with electrical cables;
wherein the plurality of studs are snap fit into slots in a bottom wall of the first housing member; and the first housing member and the second housing member provide a chamber to receive at least one electrical connector such that the fuse assembly is disposed at least partially between the first housing member and the at least one electrical connector.

15. The electrical unit of claim 14, wherein, in an assembled configuration, at least some of the fuse assembly is disposed between the bottom wall of the first housing member and said at least one electrical connector.

16. A method of assembling an electrical assembly, the method including:
providing a first housing member;
providing a second housing member including a circuit board and a plurality of electrical terminals connected to the circuit board;
connecting a fuse assembly to the first housing member;
disposing at least one electrical connector of a wiring harness such that at least some of the fuse assembly is disposed between the at least one electrical connector and a bottom wall of the first housing member; and
connecting the first housing member with the second housing member;
wherein connecting the first housing member with the second housing member includes inserting the plurality of electrical terminals into the at least one electrical connector; and the fuse assembly is connected to the first housing member before the at least one electrical connector is disposed.

17. The method of claim 16, wherein the at least one electrical connector includes a first electrical connector and a second electrical connector; a first portion of the fuse assembly is disposed between the first electrical connector and the first housing member; and a second portion of the fuse assembly is disposed between the second electrical connector and the first housing member.

* * * * *